United States Patent
Poloni

(10) Patent No.: US 12,008,848 B2
(45) Date of Patent: Jun. 11, 2024

(54) ADAPTIVE FUEL AND CHARGE CONSUMPTION ESTIMATION IN POWERTRAIN SYSTEMS

(71) Applicant: Garrett Transportation I Inc., Torrance, CA (US)

(72) Inventor: Tomas Poloni, Malinovo (SK)

(73) Assignee: Garrett Transportation I Inc., Torrance, CA (US)

( * ) Notice: Subject to any disclaimer, the term of this patent is extended or adjusted under 35 U.S.C. 154(b) by 277 days.

(21) Appl. No.: 17/482,107

(22) Filed: Sep. 22, 2021

(65) Prior Publication Data

US 2023/0090042 A1 Mar. 23, 2023

(51) Int. Cl.
*G07C 5/08* (2006.01)
*G01R 21/133* (2006.01)
*G07C 5/00* (2006.01)

(52) U.S. Cl.
CPC ......... *G07C 5/0808* (2013.01); *G01R 21/133* (2013.01); *G07C 5/0816* (2013.01); *G07C 5/008* (2013.01)

(58) Field of Classification Search
CPC ............ F02D 2200/0625; G07C 5/008; G07C 5/0816
See application file for complete search history.

(56) References Cited

U.S. PATENT DOCUMENTS

| | | | |
|---|---|---|---|
| 8,700,546 B2 | 4/2014 | Germann et al. | |
| 10,184,439 B2 | 1/2019 | Claude et al. | |
| 10,295,355 B2 | 5/2019 | Baglino et al. | |
| 10,364,764 B2 | 7/2019 | Wang et al. | |
| 10,619,582 B2 | 4/2020 | Lutz et al. | |
| 10,641,214 B2 | 5/2020 | Dudar | |
| 10,852,150 B2 * | 12/2020 | Li | G06N 20/00 |
| 2009/0216688 A1 | 8/2009 | Kelty et al. | |
| 2010/0138178 A1 | 6/2010 | Paryani et al. | |
| 2010/0174667 A1 | 7/2010 | Vitale et al. | |

(Continued)

FOREIGN PATENT DOCUMENTS

DE 102014220079 A1 10/2014
DE 102017202975 A1 1/2018

(Continued)

OTHER PUBLICATIONS

Extended European Search Report for EP2218851104 dated Feb. 13, 2023, 8 pages.

(Continued)

*Primary Examiner* — Long T Tran
(74) *Attorney, Agent, or Firm* — Seager, Tufte & Wickhem, LLP

(57) ABSTRACT

Engine systems, vehicles and methods related to refueling in conjunction with infrastructure to vehicle communication. A vehicle or engine system may receive refueling information including a fuel quantity at a refueling event, and uses the refueling information to identify and/or eliminate measurement or modelling bias in the underlying engine system controls. The vehicle may also self-determine fuel efficiency. The vehicle may use charging data, rather than refueling data, to perform calculations of battery life, state of charge, state of health, and efficiency in electric vehicle examples.

12 Claims, 14 Drawing Sheets

(56) References Cited

U.S. PATENT DOCUMENTS

| | | | |
|---|---|---|---|
| 2010/0332363 A1* | 12/2010 | Duddle | G06Q 40/12 |
| | | | 705/41 |
| 2011/0156641 A1 | 6/2011 | Kishiyama et al. | |
| 2012/0139481 A1 | 6/2012 | Tani | |
| 2013/0307475 A1 | 2/2013 | Kishiyama et al. | |
| 2013/0221928 A1 | 3/2013 | Kelty et al. | |
| 2013/0144519 A1* | 6/2013 | Nakano | B60L 50/16 |
| | | | 701/123 |
| 2013/0221916 A1 | 8/2013 | Kelty et al. | |
| 2014/0379183 A1 | 12/2014 | Long | |
| 2016/0123752 A1* | 5/2016 | Kandula | G01C 21/3469 |
| | | | 701/123 |
| 2016/0149272 A1 | 5/2016 | Imaizumi | |
| 2017/0074918 A1 | 3/2017 | Stewart et al. | |
| 2017/0287237 A1* | 10/2017 | Koenig | G07C 5/008 |
| 2018/0016131 A1* | 1/2018 | Varini | G07F 13/025 |
| 2018/0149064 A1 | 5/2018 | Pachner et al. | |
| 2019/0006723 A1 | 1/2019 | Martin et al. | |
| 2019/0283617 A1 | 9/2019 | Paryani | |
| 2019/0367353 A1 | 12/2019 | McNamara et al. | |
| 2020/0070679 A1* | 3/2020 | Wang | B60L 58/21 |
| 2020/0175782 A1 | 6/2020 | Tokman et al. | |
| 2021/0312722 A1* | 10/2021 | Nakashima | G07C 5/008 |

FOREIGN PATENT DOCUMENTS

| | | | |
|---|---|---|---|
| WO | 2013033347 A1 | 3/2013 | |
| WO | 2016168213 A3 | 10/2016 | |

OTHER PUBLICATIONS

U.S. Appl. No. 17/008,076 and the entirety of the application filed Aug. 31, 2020.

U.S. Appl. No. 16/951,208 and the entirety of the application filed Nov. 18, 2020.

Liu et al., "Modeling and Control of a Power-Split Hybrid Vehicle," IEEE Transaction on Control Systems Technology, vol. 16 (6), p. 1242-1251, Nov. 2008.

Pavlovic, J., et al., "How Accurately Can We Measure Vehicle Fuel Consumption in Real World Operation?" Transportation Research Part D 90 (2021) 102666, 2021.

Ludicrous, Z., "Teslafi Review: Still Worth $50/Year Among Up-and-Coming Alternatives?" https://teslatuneup.com/teslafi-review/, retrieved Sep. 16, 2021.

Vanderwerp, D., "This Is How Tesla Owners Geek Out on Their Cars' Data" Car and Driver Magazine, https://www.caranddriver.com/news/a31945275/tesla-car-data-teslafi/, retrieved Sep. 16, 2021.

Communication pursuant to Article 94(3) EPC/Examination Report for EP22188511.4 issued Mar. 11, 2024, 5 pages.

* cited by examiner

ADAPTIVE FUEL AND CHARGE CONSUMPTION ESTIMATION IN POWERTRAIN SYSTEMS

BACKGROUND

Various regulatory entities mandate a range of emissions and fuel efficiency standards. Conformity to fuel efficiency standards has historically been demonstrated by testing in controlled settings. However, studies have shown repeatedly that there is a difference between real-world fuel efficiency and that which has been achieved in controlled settings. The discrepancy is referred to in the literature as the fuel consumption gap. Not only is there a fuel consumption gap, studies have found that the gap has increased over time. (Pavlovic et al., How Accurately Can We Measure Vehicle Fuel Consumption in Real World Operation). New regulations are being developed and, in some geographies, have been released for monitoring the fuel consumption gap. What is needed then are new and improved ways for a vehicle to monitor and/or control fuel consumption.

OVERVIEW

The present inventors have recognized, among other things, that a problem to be solved is the need for new and/or alternative ways for vehicles to monitor and control fuel consumption. In some examples, a fuel consumption model is provided for a vehicle which is configured for updating over time as the vehicle is operated, including updating operations and/or data reporting using fuel data obtained when the vehicle is refueled. The fuel consumption model may be updated over time to account for model biases, in some examples. For electric vehicles, a current consumption metric may be modeled and updated over time to account for measurement bias in the system in some examples.

A first illustrative and non-limiting example takes the form of a vehicle comprising an engine configured to consume a fuel; a fuel receiving structure for receiving the fuel; a controller configured to monitor fuel consumption by the engine; a communication apparatus coupled to the controller and configured for communication with an offboard refueling station; wherein: the controller is configured to monitor fuel consumption by the application of a fuel flow model having a fuel flow variable and a bias term; the controller is configured to load refueling data from the communication apparatus to determine a quantity of fuel added to the fuel receiving structure at the offboard refueling station; and responsive to receiving refueling data from the communication apparatus, the controller is configured to update the fuel flow model.

Additionally or alternatively, the controller is further configured to determine a divergence from the fuel flow model indicated by the refueling data and, responsive thereto, to generate an alert to a user of the vehicle.

Additionally or alternatively, the controller is further configured to determine a divergence from the fuel flow model indicated by the refueling data and, responsive thereto, to communicate to an offboard observer that an error has occurred.

Additionally or alternatively, the controller is further configured to update the fuel flow model by: determining an estimated quantity of fuel used from a first refueling event to a second refueling event by application of the fuel flow model; determining an actual quantity of fuel used from the first refueling event to the second refueling event as determined from refueling data for the second refueling event; and calculating and implementing an adjustment to the bias term.

Additionally or alternatively, the controller is further configured to calculate an actual fuel efficiency metric for the vehicle by determining a distance traveled from a first refueling event to a second refueling event and to then perform at least one of communicating the actual fuel efficiency metric to a remote location, or storing the actual fuel efficiency metric.

Additionally or alternatively, the controller is configured to identify a discrepancy between the fuel efficiency metric and a standard fuel efficiency for the vehicle, to determine whether the discrepancy exceeds a threshold and, responsive to the discrepancy exceeding the threshold, to generate an alert to a user of the vehicle.

Additionally or alternatively, the controller is configured to identify a discrepancy between the fuel efficiency metric and the standard fuel efficiency for the vehicle, to determine whether the discrepancy exceeds a threshold and, responsive to the discrepancy exceeding the threshold, to communicate to an offboard observer that an error has occurred.

Additionally or alternatively, the controller is configured to monitor fuel efficiency on an ongoing basis using the fuel flow model by, for each of a set of time periods: characterizing a state of the vehicle during the time period into at least two categories based on at least a speed of the vehicle; calculating and storing an estimated fuel usage during the time period; and calculating and storing an estimated fuel efficiency during the time period.

Additionally or alternatively, the controller is configured to monitor fuel efficiency on an ongoing basis using the fuel flow model by, for each of a set of time periods: calculating and storing a speed of the vehicle during the time period; calculating and storing an estimated fuel usage during the time period; and calculating and storing an estimated fuel efficiency during the time period.

Additionally or alternatively, the controller is further configured to estimate a plurality of fuel efficiencies for the vehicle, each of the plurality of fuel efficiencies corresponding to a particular range of speeds for the vehicle, using the stored data for the set of time periods.

Another illustrative and non-limiting example takes the form of a vehicle comprising: a rechargeable battery; a motor configured to move the vehicle using current obtained from the rechargeable battery; a controller configured to monitor energy consumption by the vehicle using an onboard current monitor; a communication apparatus coupled to the controller and configured for communication with an offboard charging station; wherein: the controller is configured track a bias term associated with the onboard current monitor; the controller is configured to load charging data from the communication apparatus to determine a quantity of charge added to the battery by the offboard charging station in a charging event; responsive to receiving the charging data from the communication apparatus, the controller is configured to update the bias term; and the controller is configured to use the updated bias term to track current consumption following the receipt of the charging data to determine and report range of the vehicle to a user.

Additionally or alternatively, the controller is configured to estimate a quantity of charge used in the vehicle prior to the charging event using data from the onboard current monitor and the bias term, and to calculate remaining battery life by comparing the estimated quantity of charge used to the quantity of charge added.

Additionally or alternatively, the controller is configured to use the bias term to calculate efficiency of the vehicle.

Additionally or alternatively, the controller is further configured to update the bias term in the following manner: determine an estimated quantity of charge used from a first recharging event to a second recharging event by using the onboard current monitor; comparing the estimated quantity of charge used to the quantity of charge added to the battery; and calculating and implementing an adjustment to the bias term.

Additionally or alternatively, the controller is further configured to update the bias term without a recharging event taking place, by monitoring a change in a voltage output by the battery to determine a change in remaining capacity of the battery between a first point in time and a second point in time, and comparing the change in remaining capacity of the battery to estimated current consumed between the first point in time and the second point in time.

Still another illustrative and non-limiting example takes the form of a method of tracking fuel consumption in a vehicle; wherein the vehicle includes an engine configured to consume a fuel; a fuel receiving structure for receiving the fuel; a controller configured to monitor fuel consumption by the engine; a communication apparatus coupled to the controller and configured for communication with an offboard refueling station; the method comprising: monitoring fuel consumption by the application of a fuel flow model having a fuel flow variable and a bias term; when a refueling event occurs, loading refueling from the communication apparatus to determine a quantity of fuel added to the fuel receiving structure at the offboard refueling station; and responsive to receiving refueling data from the communication apparatus, updating the fuel flow model.

Additionally or alternatively, the method further comprises identifying a divergence from the fuel flow model indicated by the refueling data and, responsive thereto, generating an alert to a user of the vehicle.

Additionally or alternatively, the step of updating the fuel flow model is performed by: determining an estimated quantity of fuel used from a first refueling event to a second refueling event by application of the fuel flow model; determining an actual quantity of fuel used from the first refueling event to the second refueling event using refueling data for the second refueling event; and calculating and implementing an adjustment to the bias term.

Additionally or alternatively, the method further comprises calculating an actual fuel efficiency metric for the vehicle by determining a distance traveled from a first refueling event to a second refueling event; and at least one of: communicating the actual fuel efficiency metric to a remote location, or storing the actual fuel efficiency metric in a non-transient memory associated with the controller.

Additionally or alternatively, the method further comprises identifying a discrepancy between the fuel efficiency metric and a standard fuel efficiency for the vehicle; determining whether the discrepancy exceeds a threshold; and responsive to the discrepancy exceeding the threshold, generating an alert to a user of the vehicle.

This overview is intended to introduce the present subject matter. It is not intended to provide an exclusive or exhaustive explanation. The detailed description is included to provide further information about the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
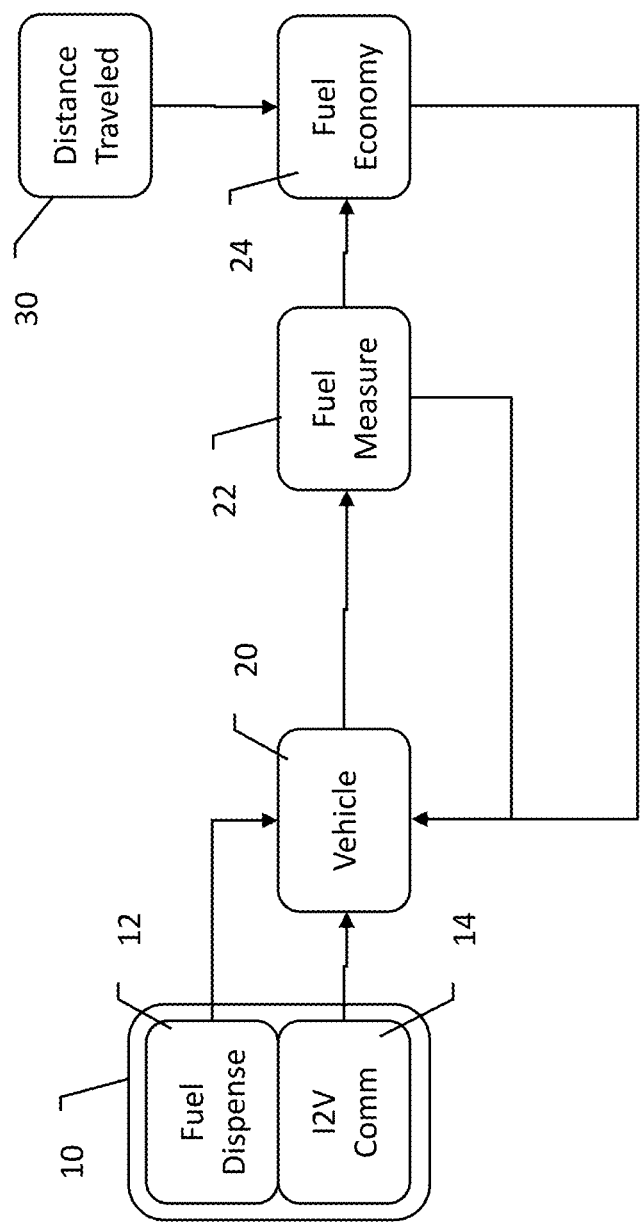
FIG. 1 is a block diagram illustrating the use of I2V communication for a fuel consumption model update and fuel economy calculation.

FIG. 1 is a block diagram illustrating the use of I2V communication for fuel economy calculation. Infrastructure to vehicle (I2V) communication is an emerging technology in which a vehicle communicates, such as by wireless communication (via cellular communication, ISM band, Bluetooth, various IEEE 802.11 standards, etc.) with a portion of the infrastructure used for vehicle management or travel. While some sources refer instead to vehicle-to-infrastructure (V2I) communication, as used herein, I2V will stand for the same concept. I2V is the wireless exchange of data between vehicles and road infrastructure, and may encompass wireless and often bi-directional communication between a vehicle and infrastructure components such as lane markings, road signs, traffic lights, and refueling stations.

In FIG. 1, a vehicle 20 is at a refueling station 10, having a fuel dispenser 12 and an I2V communication block 14. The fuel dispenser 12 dispenses fuel to the vehicle 20, and the I2V communication block 14 wireless communicates with the vehicle 20. The I2V communication block 14 may, for example, communicate regarding the type and quantity of fuel provided by the fuel dispenser. The fuel dispensed may be of any suitable type, including gasoline, diesel or other petroleum-based fuel, including fuel blends such as E-85 ethanol blend, as well as hydrogen, compressed natural gas (CNG), propane, natural gas, etc. The vehicle 20 includes a fuel receiving structure, such as a fuel tank, configured for receipt of the fuel. Rather than fuel, electric charge may be issued, and the refueling station 10 may instead be a recharging station, such that a quantity of charge issued may be communicated. This results in the vehicle 20 having a fuel (or charge) measure 22, known with relative certainty and accuracy from the refueling or recharging station 10. The vehicle 20 may further reference an odometer or global positioning system (GPS) to obtain a distance traveled 30, for example from a prior refueling instance. The distance traveled 30 can be divided by the fuel measure 22 to generate a fuel economy measure 24.

The vehicle may contain or include an engine control unit (ECU). The ECU may include a microcontroller or microprocessor, as desired, or other logic/memory, application specific integrated circuit (ASIC), etc., with associated memory for storing observed characteristics as well as operational instruction sets in a non-transitory medium, such as a Flash or other memory circuitry. Any data that is or can be stored by the ECU on-board may also or instead be transmitted off-vehicle to the cloud or a central server using any suitable communications method, such as, for example and without limitation, cellular, WiFi, broadband, Bluetooth, etc. The ECU will be coupled to various actuators, sensors, and user input/output devices (touchscreen, pedals, steering wheel, etc.) throughout the vehicle 20, to obtain data and issue control signals as needed. The ECU may couple to other vehicle control systems such as by a controller area network (CAN) bus or other wired or wireless link. As used herein, a "controller" may be an ECU or a plurality of ECUs in communication with one another. In some examples, a first ECU may communicate with a second ECU and cooperatively provide functionality, such for example and without limitation, having a first ECU calculate fuel or current consumption using a model, and a second ECU calculate and determine energy or fuel efficiency metrics, while the second ECU or still another ECU communicates the generated metrics or other data, such as alerts, off-board (that is, to a computer that is not on the vehicle) or to a user. In another example, one or more ECUs may cooperate with an off-board device to provide select functions, such as determining fuel or current consumption on-board and determining efficiency off-board.

For example, the ECU may be configured to communicate via a CAN bus to other control units dedicated to select vehicle and engine componentry, such as another ECU that manages engine operations, an ECU that manages vehicle infotainment systems, etc. Some specific examples may include, for example, an engine controller that communicates to actuators associated with engine operation in which fuel is provided to an engine and combined with incoming airflow to generate power for the system. A variety of specific examples are discussed further below.

In operation, modern vehicles are configured to apply sophisticated control algorithms to provide desirable combination of performance and emissions parameters. For example, a particular concern is the generation of nitrogen oxides (NOx), a tightly controlled emission. To optimize engine behavior, the system may be configured to determine an appropriate blend of incoming fresh air, recirculated exhaust gasses, and fuel in a combustion chamber. Control over this blend of inputs to the combustion chamber allows control over the NOx emissions. A Lambda sensor, combined with knowledge of the injected fuel mass, can be used to estimate fresh air input, and an exhaust gas recirculation system can then be controlled to optimize the blend of inputs to the combustion chamber. However, if the fuel mass is erroneous, the remaining calculations will carry through the error. While this example focuses on an internal combustion engine, other examples apply in other contexts.

Figure 2:
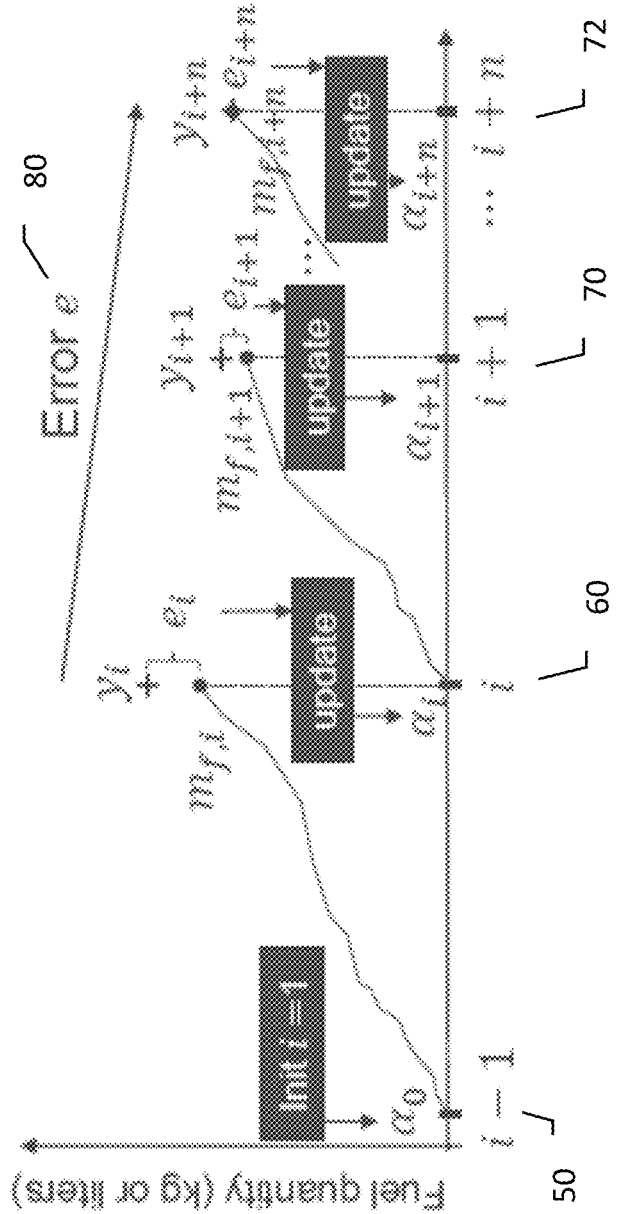
FIG. 2 shows convergence of an estimated fuel quantity error.

The data obtained by the vehicle may be used for additional purposes beyond the calculation of fuel economy as shown in FIG. 1. For example, FIG. 2 illustrates how the obtained fuel quantity can be used to enhance the fuel mass metric used in various engine control methods. The fuel mass provided to the engine is a metric that the vehicle may approximate from a first point in time as $m_f$. At a first point in time 50, the vehicle is filled with fuel to its maximum capacity. As the vehicle is used from time 50 to a subsequent refueling at 60, the system may sum the fuel used over time as in Equation 1:

$$m_{f,i} = \Sigma_{i-1}^{i} \dot{m}_f \quad \text{\{Equation 1\}}$$

Using the actual fuel quantity, $y_i$, obtained via the I2V communication, then a fuel quantity error, $e_i$, specific to the given time period from time 50 to the refueling at 60, can be calculated as in Equation 2:

$$e_i = y_i - m_{f,i} \quad \text{\{Equation 2\}}$$

Using this error, the underlying fuel flow model can be updated at each refueling. Thus, as shown in FIG. 2, from an initialization at 50, to the first refueling 60, a first fuel error $e_i$ is calculated. A fuel bias $\alpha_i$, which is incorporated in to the fuel flow model, is updated using the fuel error $e_i$. At each subsequent refueling, 70, 72, the error will be updated due to the prior updating of the fuel bias value and fuel flow model. As shown at 80, the error converges to zero over time. If the error fails to converge to zero, or if the error shifts away from zero after converging, a fault may be identified in some examples. Faults may include, for example and without limitation, fouling, failure and/or aging of system componentry, such as aging of a fuel injector, fouling of a fuel filter, etc.

Figure 3:
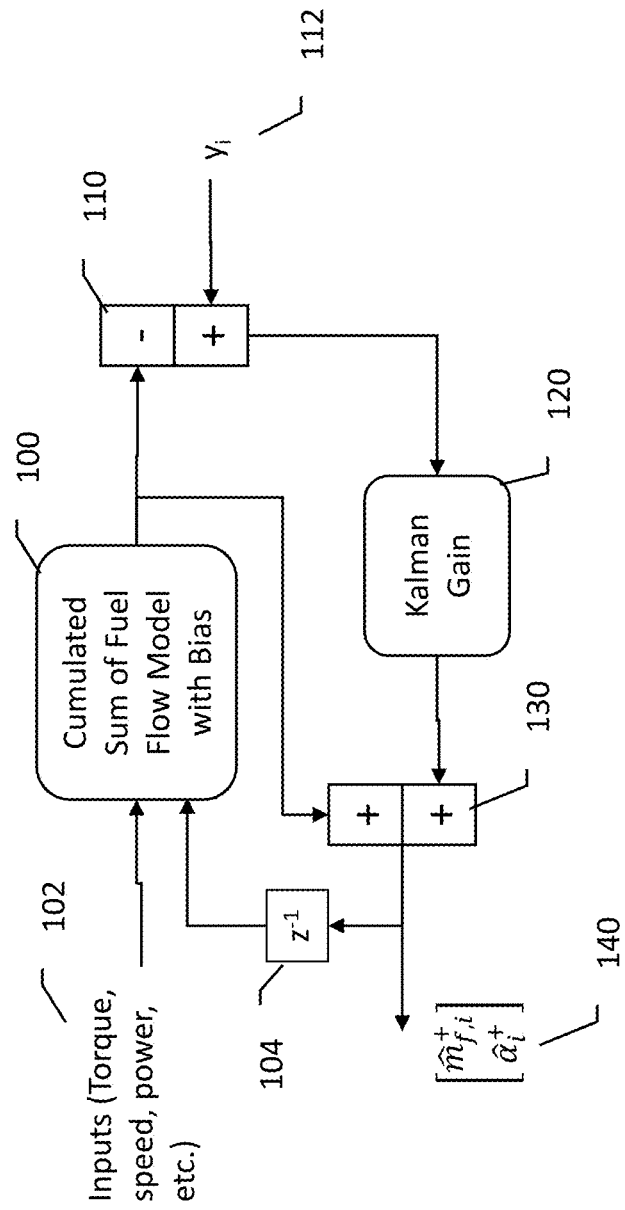
FIG. 3 is a block diagram illustrating the use of fuel quantity inputs to correct a fuel flow model.

FIG. 3 is a block diagram illustrating the use of fuel quantity inputs to correct a fuel flow model. The method illustrated relies on a cumulated sum of the fuel flow model, with bias, as indicated at 100. This cumulated sum can be calculated from one refueling to the next, for example, as shown by FIG. 2. Each refueling may be referred to herein as a "tank event." System inputs may include torque, speed, power, etc. as called for by the user or driver, as indicated at 102.

In an illustrative example, the expected measurement interval (tank to tank event) is much larger than the integration step, which may be in terms of seconds, tenths of seconds, etc. One approach for estimation for this type of system is to treat it as a hybrid system with continuous dynamics and discrete measurements. A hybrid extended Kalman filter (EKF) can be built, in one example, based on the hybrid system model in which the continuous time dynamics are given by the continuous fuel flow model $\dot{m}_f$, which may be represented in, for example, mass or volume per unit time (kg/s or liters/s, for example), and a continuous bias rate model, $\alpha$. Treating the bias as additive, the model may be represented by Equations 3 and 4:

$$\dot{m}_f = f_f(\cdot) + \alpha + w_1 \quad \text{\{Equation 3\}}$$

$$\dot{\alpha} = w_2 \quad \text{\{Equation 4\}}$$

Where $f_f(\cdot)$ is a general expression of a fuel flow model, which may be dependent on the kind of fuel used (gasoline, diesel, compressed natural gas (CNG), propane, hydrogen-fuel cell, or any other suitable fuel). Such a fuel flow model may use a variety of inputs, as noted at 102, such as engine speed and/or torque, power, etc. The bias may be treated instead as multiplicative, by substituting Equation 5 for Equation 3:

$$\dot{m}_f = f_f(\cdot) + \alpha f_f(\cdot) + w_1 \quad \text{\{Equation 5\}}$$

Any model formulation combining a general fuel flow model with a bias term may be used, as desired. In Equations 4-6, the process noises $w_1$ and $w_2$ are the continuous-time white noises having defined covariances generated in the Kalman filter design (that is, for example, the Q matrix of the hybrid EKF).

At each tank event, the I2V fuel measurements $y_i$ are obtained, and modeled as shown in Equation 6:

$$y_i = m_{f,i} + v_i \quad \text{\{Equation 6\}}$$

Where $m_{f,i}$ is the integrated fuel state and $v_i$ is the discrete time white noise defined by its variance (that is, for example, the R matrix of the hybrid EKF). The unknown state vector $x_i$ that is to be estimated by the hybrid EKF then has one state $m_{f,i}$ and one bias parameter $\alpha_i$.

The hybrid EKF will then return an a posteriori estimate of total fuel quantity as $\hat{m}_{f,i}^+$, which is reset to zero for the next tank event, and an a posteriori estimate of the fuel bias $\hat{\alpha}_{f,i}^+$. The a posteriori estimate of the fuel bias can then be used as the updated bias value to be inserted into the computations of cumulated fuel sum until a subsequent tank event. In this way, the fuel bias is updated at each tank event, while the consumed fuel quantity is reset to zero.

Applying the above to FIG. 3, the inputs at 102 are accounted for to calculate the cumulated sum of fuel flow model, with bias, as indicated at 100. The cumulated fuel is then subtracted at 110 from the quantity of fuel $y_i$ 112 reported by the I2V system. The output is provided to a Kalman gain block 120, and the output of the Kalman gain block 120 is summed with the cumulated sum of the fuel flow as indicated at 130, to then generate the a posteriori estimate of total fuel quantity and fuel bias, as indicated at 140. The feedback loop indicated at 104 then updates the fuel flow model for the next time period following the tank event.

Figure 4:
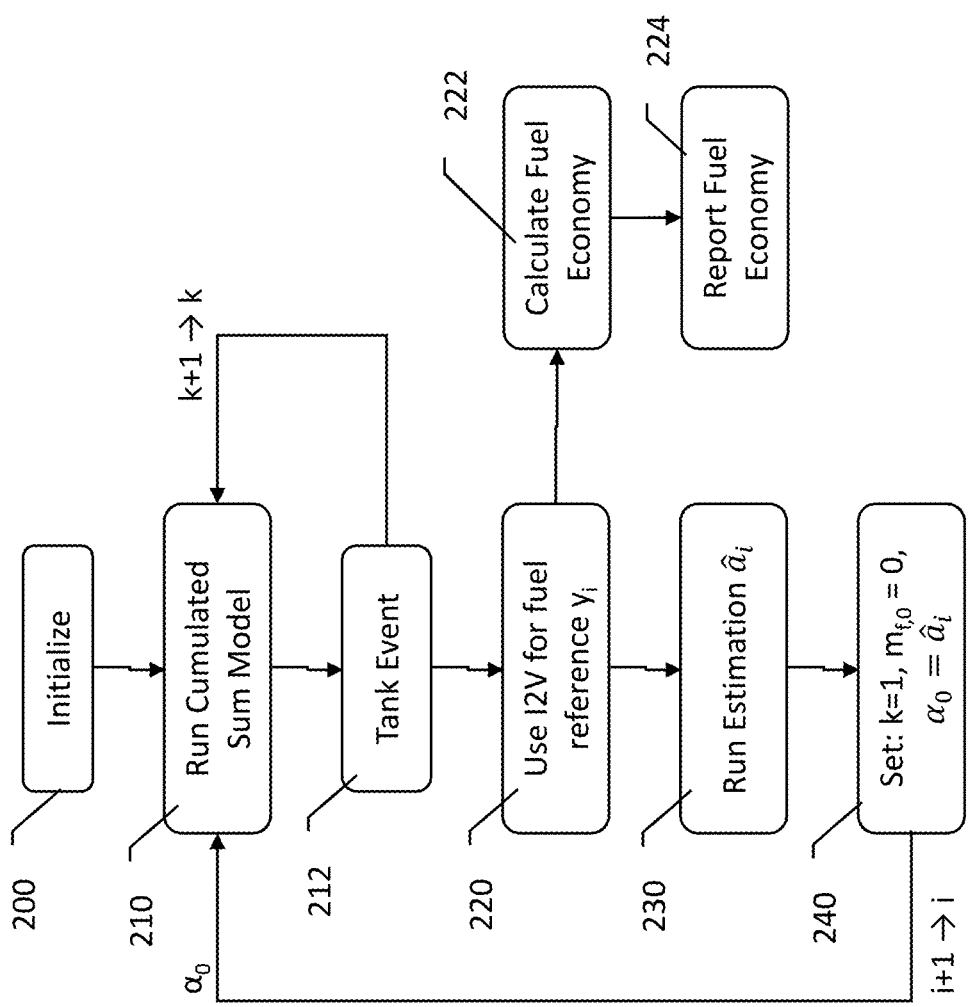
FIGS. 4-6 are block diagrams illustrating determination of fuel flow model errors.
Figure 5:
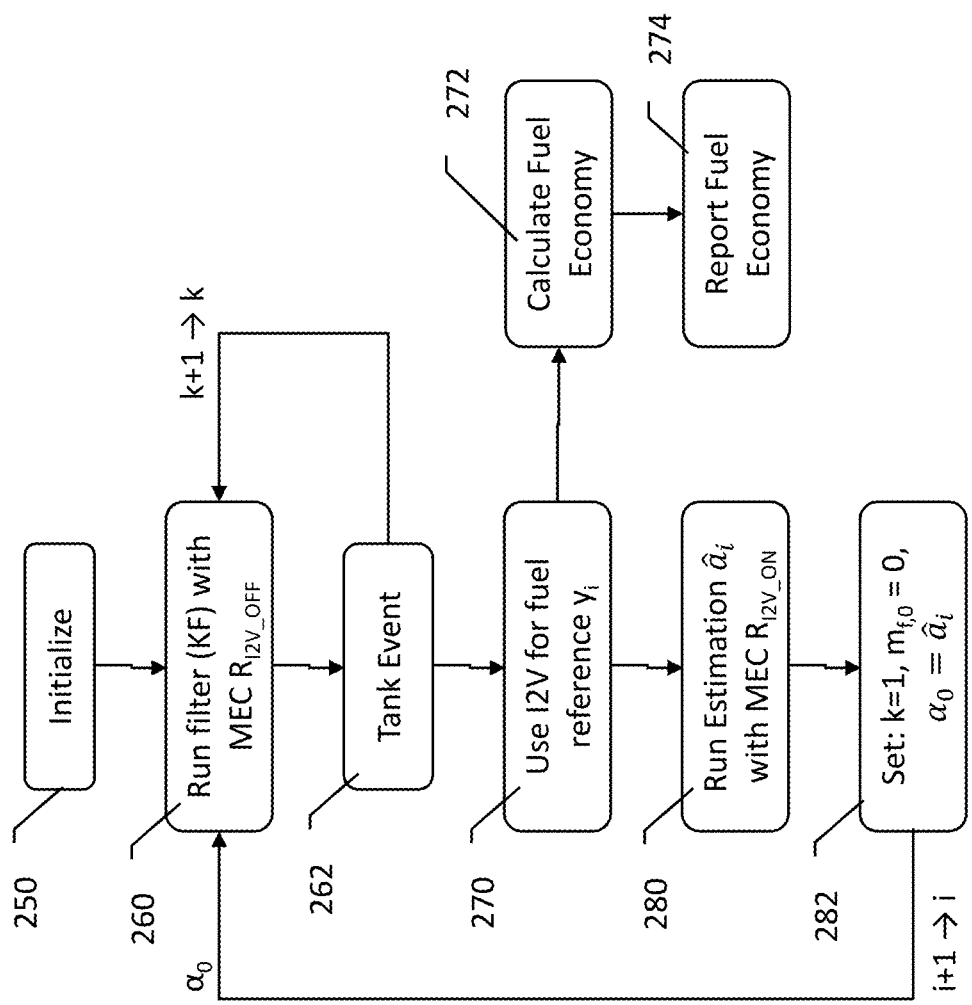

FIGS. 4-5 are block diagrams illustrating determination of fuel flow model errors. Starting FIG. 4, the method starts with initializing the method 200. Initialization 200 occurs, for example, when the fuel tank is filled and a fuel tank state is recorded either through a vehicle-internal sensor (i.e., a sensor associated with the fuel tank to indicate refueling is completed), or via I2V communication. The initial bias $\alpha_0$ is set, either by drawing from a previously determined or calculated condition, or by setting the bias to zero if it is not known. For purposes of the method, the integration step index, k, is set to 1, and the consumed fuel mass for the cycle is set to zero (that is, $m_{f,0}=0$ is set). The distance traveled during the cycle is also set to zero.

Next, the cumulated sum fuel flow model is operated, as indicated at 210, and an iterative process takes place as the cumulated fuel flow is calculated in a cycle with block 212, which determines whether a tank event has occurred. If no tank event takes place, the method loops back to block 210 and k is incremented to k+1. Once a tank event occurs at 212, the 210/212 loop is interrupted, and the process flows to block 220, where, in this example, I2V communication is used to obtain a fuel reference, $y_i$. The method may then include calculating fuel economy at 222, by obtaining an odometer-based, or GPS-based (or any other source) distance travelled. Fuel economy as calculated at 222 may be reported at 224, such as by generating a communication to the vehicle operator, or by communicating off-vehicle to a central server such as a fleet manager for a fleet of vehicles. Such fuel economy data may be used by the central server, fleet manager, or other cloud-based system to identify anomalies, such as leaks, injector miscalibrations, and/or other failures. In addition, emissions limits for a vehicle or fleet may be determined by analyzing the fuel usage. In the event of, for example, a CO2 tax being implemented, the fuel consumption data may be used to determine the applicable CO2 tax, for example.

In addition, having obtained the fuel reference $y_i$ at 220, the system then runs a new estimation analysis $\hat{\alpha}_i$, thereby obtaining a new fuel bias estimate from the bias parameter, which in this case will have been updated from its prior value using the new data generated at 230. The system is then configured to perform the analysis again for a next time period between tank events as indicated at 240. In an example, the method may include incrementing i to i+1, resetting k to 1, resetting the consumed fuel mass for the cycle to zero (that is, $m_{f,0}=0$ is set), updating the fuel bias using the most recent estimation from block 230, and also resetting the distance traveled for the cycle to zero. The method then returns to block 210. While FIG. 4 suggests continuous performance of the fuel bias estimate at each tank event, this need not always be the case; not every tank event may trigger the analysis.

In the event of partial refueling, the quantity of fuel added to vehicle is then known. In some examples, the quantity added may not allow an update of the error or fuel bias metric, because the actual fuel consumed would not automatically be known from the amount added via partial refueling. For such a system, the vehicle may simply record the amount added and awaits a subsequent, complete refueling to recalculate the error term and update the fuel bias.

In some examples, the system may include a fuel tank monitor that can determine the amount of fuel consumed as by, for example, measuring a weight or volume of fuel added during the partial refueling. For example, a system may include a weight measuring apparatus, or may determine from a level of filling of the tank using a float, or may include a sensing apparatus on the side of the fuel tank, as desired, to determine the quantity of fuel that has been consumed. For systems having a fuel tank measurement available, a "tank event" as used herein may include the taking of a fuel tank measurement. Such fuel tank measurements may be performed, for example, at intervals or on command, or may be performed when the vehicle is at rest (and/or with the engine off), since static conditions may be useful to obtain an accurate fuel tank measurement. In other examples, a fuel tank measurement may be performed at any time.

FIG. 5 shows a more particularized example than FIG. 4. Initialization 250 occurs, again and for example, when the fuel tank is filled and a fuel tank state is recorded either through a vehicle-internal sensor (i.e., a sensor associated with the fuel tank to indicate refueling is completed), or via I2V communication. The initial bias $\alpha_0$ is set, either by drawing from a previously determined or calculated condition, or by setting the bias to zero if it is not known. For purposes of the method, the integration step index, k, is set to 1, and the consumed fuel mass for the cycle is set to zero (that is, $m_{f,0}=0$ is set). The distance traveled during the cycle is also set to zero.

Next, a Kalman filter is operated, as indicated at 260, using for example the approach shown above in FIG. 3. An iterative process takes place as the cumulated fuel flow and associated white noise error are calculated in a cycle with block 262, which determines whether a tank event has occurred. If no tank event takes place, the method loops back to block 260 and k is incremented to k+1. Once a tank event occurs at 262, the 260/262 loop is interrupted, and the process flows to block 270, where, in this example, I2V communication is used to obtain a fuel reference, $y_i$. The method may then include calculating fuel economy at 272, by obtaining an odometer-based, or GPS-based (or any other source) distance travelled. Fuel economy as calculated at 272 may be reported at 274, such as by generating a communication to the vehicle operator, or by communicating off-vehicle to a central server such as a fleet manager for a fleet of vehicles. Such fuel economy data may be used by the central server, fleet manager, or other cloud-based system to identify anomalies, such as leaks, injector miscalibrations, and/or other failures. In addition, emissions limits for a vehicle or fleet may be determined by analyzing the fuel usage. In the event of, for example, a CO2 tax being implemented, the fuel consumption data may be used to determine the applicable CO2 tax, for example.

In addition, having obtained the fuel reference $y_i$ at 270, the system then runs a new estimation analysis $\alpha_i$, again applying the Kalman filter as in block 260, thereby obtaining a new fuel bias estimate from the bias parameter, which in this case will have been updated from its prior value using the new data generated at 280. The system is then configured to perform the analysis again for a next time period between tank events, as indicated at 282. In block 282, the process may include incrementing i to i+1, resetting k to 1, resetting the consumed fuel mass for the cycle to zero (that is, $m_{f,0}=0$ is set), updating the fuel bias using the most recent estimation from block 280, and also resetting the distance traveled for the cycle to zero. The method then returns to block 260.

In FIG. 5, blocks 260 and 280 indicate the use of the KF, with a measurement covariance matrix (MEC) which varies depending on the state of the system relative to the I2V measurement. In block 260, the system is operating without a recent tank event to reference. Therefore, the MEC to apply is indicated as $R_{I2V\_OFF}$. When the fuel measurement $y_i$ is obtained, the next operation of the KF is performed using a different MEC, indicated as $R_{I2V\_ON}$.

In an example, onboard and offboard sensor fusion takes place, to combine information from various sensors. In one example, an engine system may include an intake manifold for receiving incoming fresh air (which may be compressed if desired via a turbocharger or other compressor, and which may also be mixed with recirculated exhaust gasses using known structures for doing so, such as low pressure or high-pressure exhaust gas circulation (EGR) subsystems). The engine system may include an exhaust manifold for exiting gasses, which may pass through a turbine (if a turbocharger is used), and through any of a variety of environmental processing systems, including for example and without limitation, filters, traps, and/or converters for removing or altering exhaust gasses to reduce environmentally harmful emissions. One or more sensors may be positioned in the exhaust airstream. A specific combination may be an engine system having a mass air flow (MAF) sensor, which may be a physical sensor (such as a flow meter, Venturi meter, etc.) or which may be a virtual sensor that uses temperature, pressure and other sensor signals to calculate MAF entering the engine, as well as a oxygen sensor associated with the exhaust airstream, such as a Lambda sensor or universal exhaust gas oxygen (UEGO) sensor. It is known that the MAF and Lambda sensor outputs can be combined to estimate fuel quantities, but both MAF and Lambda sensor are subject to errors both persistent and condition-specific, including both white noise as well as bias errors. Fusion, in this context, can use the fuel mass flow, both model-based and determined using I2V communications, to identify and/or update bias and error terms throughout the calculation and system.

In an example, each of MAF sensor (virtual or physical) and Lambda sensor outputs are available, along with I2V fuel measurement information. A discrete Kalman filter measurement model of the fuel bias and MAF sensor can be given as:

$$y_{1,k}=\alpha_k+v_{1,k} \quad \{\text{Equation 7}\}$$

$$y_{2,k}=L_{th}\lambda_k[f_{k-1}(T_q,\omega)+c_u\alpha_k]+\beta_k m_{MAF,k}+v_{2,k} \quad \{\text{Equation 8}\}$$

Where $y_1$ is a pseudo measurement, and may be the last estimated fuel bias (see 140 in FIG. 3, for example) at the last tank event provided (which may be provided by a hybrid EKF is the earlier example). Also, $y_2$ is the MAF sensor measurement, $\lambda$ is the lambda sensor (or other oxygen sensor) measurement, $L_{th}$ is the stoichiometric constant for the relevant fuel, $c_u$ is a scaling constant (for mg/stroke to kg/s, or liters/s, as desired), $\beta$ is the MAF sensor bias, $m_{MAF}$ is the MAF sensor measurement, $\alpha$ is the fuel bias, and $v_1$ and $v_2$ are the discrete-time white noises defined by the covariance R matrix of the EKF.

Figure 6:
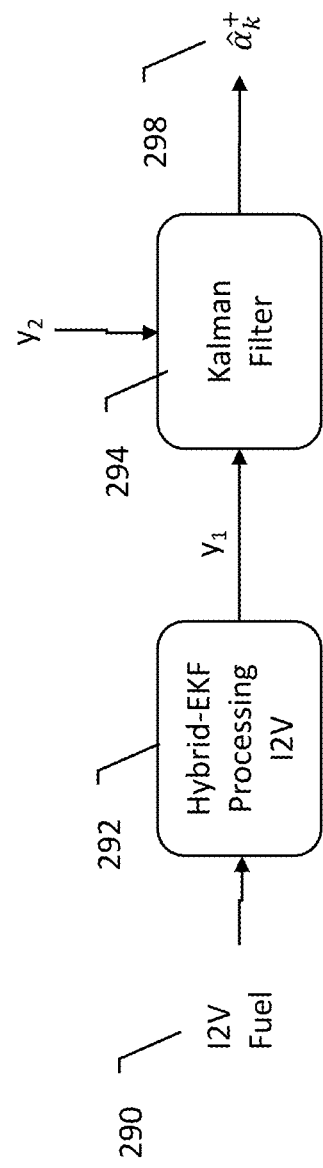
Figure 7:
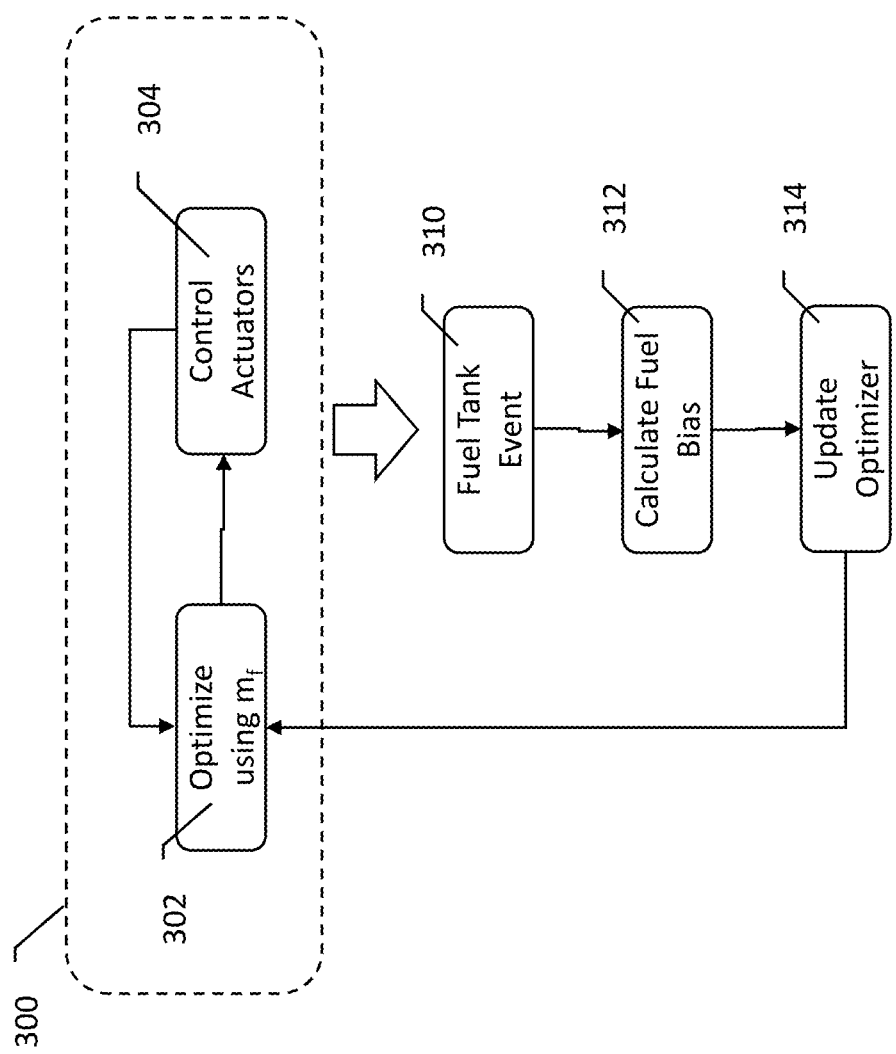
FIGS. 7-10 are block diagrams illustrating the use of fuel flow model updating to optimize performance and/or performance data for a vehicle.

FIG. 6 illustrates a utilization of Equations 7 and 8. The I2V fuel quantity can be reported at 290 and provided to a hybrid extended Kalman filter 292 for processing. The pseudo measurement $y_1$ is then provided to a second stage Kalman filter 294, along with the MAF sensor measurement $y_2$. Using the above, the Kalman filter model of the bias dynamics for at least the fuel bias can be represented as shown in Equation 9:

$$\alpha_k=\alpha_{k-1}+w_{1,k-1} \quad \{\text{Equation 9}\}$$

Where $w_1$ is the discrete time process noise defined by the covariance Q matrix. This output is shown at 298 in FIG. 6. Other metrics, including the MAF sensor bias may also be handled by the same EKF 294. A formulation for the second stage Kalman filter 294 for determining the MAF sensor bias may be found, for example, in U.S. patent application Ser. No. 16/951,208, titled ONLINE MONITORING AND DIAGNOSTICS IN VEHICLE POWERTRAINS, filed Nov. 18, 2020.

In another formulation of the onboard and offboard sensor data additional information may be fused somewhat differently. Starting again with the assumption of an MAF sensor, Lambda sensor, and the I2V fuel quantity measurement, a discrete Kalman filter measurement model of the I2V fuel quantity may be given as:

$$y_{1,k}=m_{f,k}(\alpha_{k-1})+v_{1,k} \quad \{\text{Equation 10}\}$$

$$y_{2,k}=L_{th}\lambda_k[f_{k-1}(T_q,\omega)+c_u\alpha_k]+\beta_k m_{MAF,k}+v_{2,k} \quad \{\text{Equation 11}\}$$

$$y_{3,k}=\alpha_k+v_{3,k} \quad \{\text{Equation 12}\}$$

Where $y_{1,k}$ is the I2V measurement of fuel quantity, $y_{2,k}$ is the MAF sensor measurement, $y_{3,k}$ is the last estimated fuel bias at the last tank event, and $v_{1,k}$, $v_{2,k}$, and $v_{3,k}$ are the discrete-time white noises defined by the covariance R matrix. A Kalman filter model of the integrated fuel dynamics and fuel bias can then be given as:

$$m_{f,k}=m_{f,k-1}+\Delta T f_{k-1}(T_q,\omega)+\alpha_{k-1}+w_{i,k-1} \quad \{\text{Equation 13}\}$$

$$\alpha_k=\alpha_{k-1}+w_{2,k-1} \quad \{\text{Equation 14}\}$$

Where, as before, k is the integration step index, $\Delta T$ is the integration time interval, $w_1$ and $w_2$ are the process noises defined by the covariance Q matrix.

At the time instance k, the I2V information is generally unknown or not available; instead, that information, measurement $y_1$ is available only at the tank event. As a result, the first measurement equation (Equation 10, above) is not used except during the tank event. As a result, the measurement error covariance (MEC) matrix can be schedule depending on whether the I2V information is available. When I2V information is available, MEC 1 can apply:

$$R_{I2V\_ON} = \begin{bmatrix} x_1 & 0 & 0 \\ 0 & X_2 & 0 \\ 0 & 0 & X_3 \end{bmatrix} \underset{}{\lim} \begin{bmatrix} x_1 & 0 & 0 \\ 0 & \infty & 0 \\ 0 & 0 & \infty \end{bmatrix} \quad \{\text{MEC 1}\}$$

Where $x_1$ stands for the relatively smaller noise of the I2V measurement equation, compared to the other two measurements having noise magnitudes $X_2$ and $X_3$. That is, the I2V equation will have a more significant influence in comparison to the equation modeling the MAF sensor or the pseudo-measurement equation modeling the fuel bias. The limiting case at the tank event is that only the I2V measurement is used, and the other measurement covariances are set to infinity It should be noted that the most impactful of the diagonal elements in a Kalman filter covariance matrix will be those that are smallest, thus, here, the I2V data dominates when it is available. When I2V information is not available, on the other hand, MEC 2 applies:

$$R_{I2V\_OFF} = \begin{bmatrix} \infty & 0 & 0 \\ 0 & X_2 & 0 \\ 0 & 0 & X_3 \end{bmatrix} \quad \{MEC\ 2\}$$

That is, in MEC 2, there is no input from the I2V data, and the error of the I2V information can be treated as infinite, allowing the other two measurement equations to dominate.

It should be noted that in the above example, the error covariance matrix P for the hybrid EKF may be pre-tuned to eliminate the initial bias transient. Such pre-tuning may include running the filter on offline data until the error covariance matrix P converges.

FIGS. 7-10 are block diagrams illustrating the use of fuel flow model updating to optimize performance and/or performance data for a vehicle. Starting with FIG. 7, the illustrative method relates to enhancing engine operation controls. In this example, engine performance is controlled at 300, in which optimization of engine performance is performed to control a set of actuators 304. Optimization 302 may rely on a metric for fuel mass flow, $m_f$, as indicated at 302. Optimization 302 may use, for example and without limitation, calculations using, for example, model predictive control (MPC) cost functions, linear quadratic regulator (LQR) control, proportional integral derivative (PID) control, or other control algorithms. The output of optimization 302 may include, for example, target turbocharger speed, target boost pressure, target pressure difference over the compressor, target air mass flow, etc. in the context of an operating engine associated with a turbocharger or other airflow management system. A range of sensing inputs may be used as well in control and optimization, including sensors for air intake quantity and parameters (temperature, pressure, composition), internal sensors, whether physical or virtual (that is, determined using other sensed parameters and one or more models) for temperature, pressure, composition, and/or mass flow, as well as operating parameters (engine, compressor or turbine speed, torque, power, etc.), and further including sensors for system outflows (exhaust monitors including for example and without limitation, a Lambda sensor, UEGO, etc.). The optimization is performed as indicated at 302 to generate targets, and any suitable actuators are then controlled to implement the optimized solution. The set of actuators 304 may control, for example and without limitation, fuel or other injectors, variable nozzle turbine (VNT) position, throttle valve, engine brake, after-treatment (including exhaust), exhaust gas recirculation (EGR), turbocharger, an electric motor (in an electric turbocharger for example, which may be controlled via pulse width modulation (PWM)), waste gate (WG) actuator position (stroke), position of a recirculation valve actuator, position of the variable compressor geometry actuator; and combinations thereof. The available sensors and actuators may vary depending on the details of a particular vehicle/engine. For example, there may be different sets of actuators and sensors for a hydrogen-fuel vehicle than those for a diesel engine.

When a fuel tank event 310 occurs, the system may use the methods discussed above to calculate fuel bias, drift, or error, as the case may be, as indicated at 312. The optimizer is then updated 314 to address any change in the fuel mass metric, $m_f$, thereby enhancing the accuracy of the optimization. Thus, for example, a system may include an after-treatment block adapted to remove pollutants from the air by injecting a material (such as urea) to catalyze one or more pollutants. The quantity of injected catalyzing material may be controlled in proportion to the quantity of fuel injected, and so the system may adjust the quantity of injected catalyzing material responsive to an adjustment to the fuel mass metric.

Figure 8:
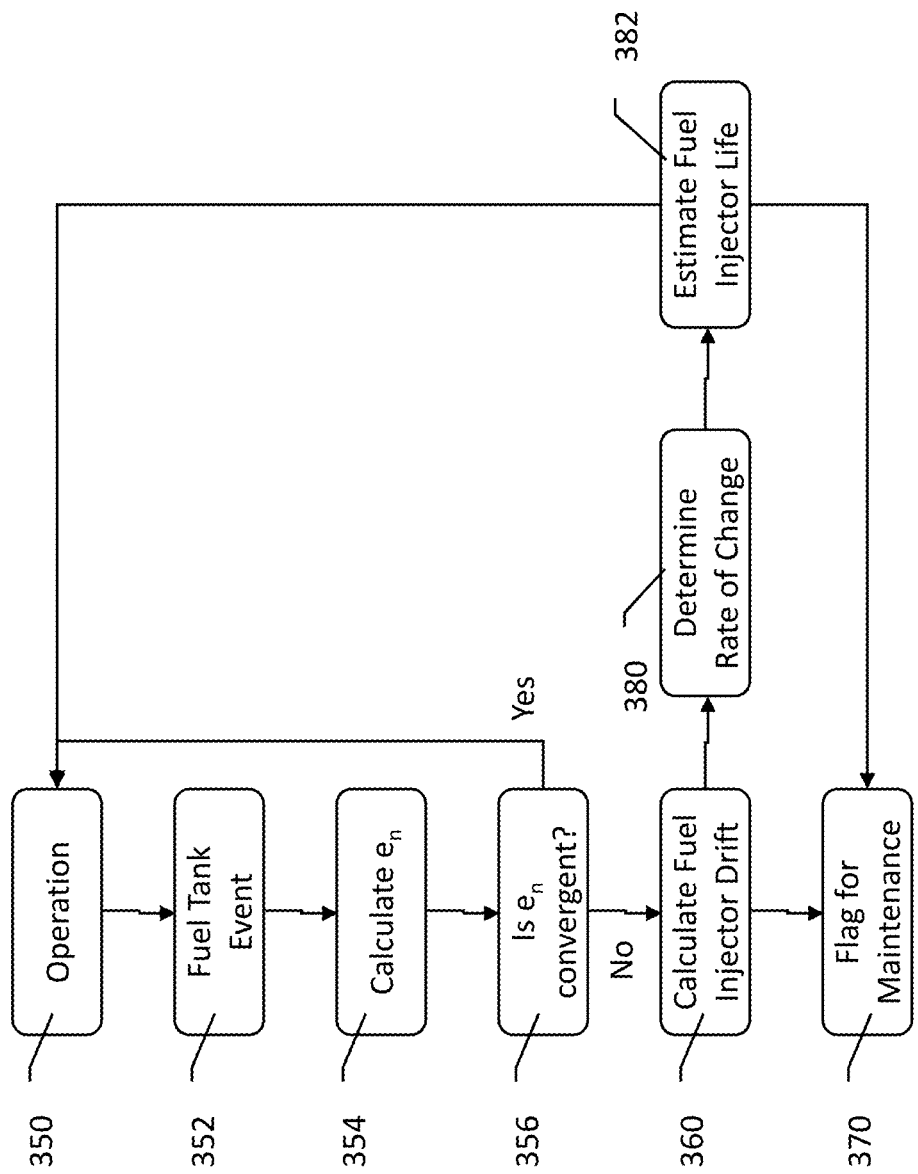

FIG. 8 shows another example. Here the engine/vehicle engages in ordinary operation as indicated at 350. When a fuel tank event takes place at 352, the system calculates the fuel quantity error, $e_n$, as indicated at 354. Next, the controller determines, by reference to prior calculations of the fuel quantity error, whether the most recent determined fuel quantity error is convergent with prior calculations. If the value is convergent at 356, the system returns to the ordinary operation 350. If the value is not convergent, some aspect of the system operation or status is may be suboptimal. In the example shown, fuel injector drift is calculated at 360, by determining how divergent the actual fuel delivered is from the nominal value for $m_f$.

If the fuel injector drift exceeds an operating threshold (such as, for example and without limitation, beyond at 5% or 10% margin from nominal), the system may raise a flag for maintenance 370, whether by issuing an onboard alert to the driver, by recording an error code, or by communicating off-board to a remote server, for example, to indicate a need for maintenance. Maintenance may include, for example and without limitation, cleaning or replacing one or more components of the fuel system. The system may in some examples continue to operate after the flag for maintenance is generated in block 370 by returning to block 350. In some examples, the maintenance flag or error code, if generated, may be removed if not repeated at a subsequent tank event 352, as may happen if a fuel injector is temporarily occluded, for example.

Additionally or alternatively to block 370, the system may determine a rate of change of the fuel quantity error or fuel injector drift, as indicated at 380. The rate and/or direction of change can be used then to estimate remaining fuel injector life, as indicated at 382. If remaining life is below a threshold (such as being less than an expected or scheduled time for next maintenance), the system may be flagged for maintenance at 370. The estimated remaining life 382 may be recorded and/or reported, as desired, onboard or off-board. The system can again return to operating block 350.

Figure 9:
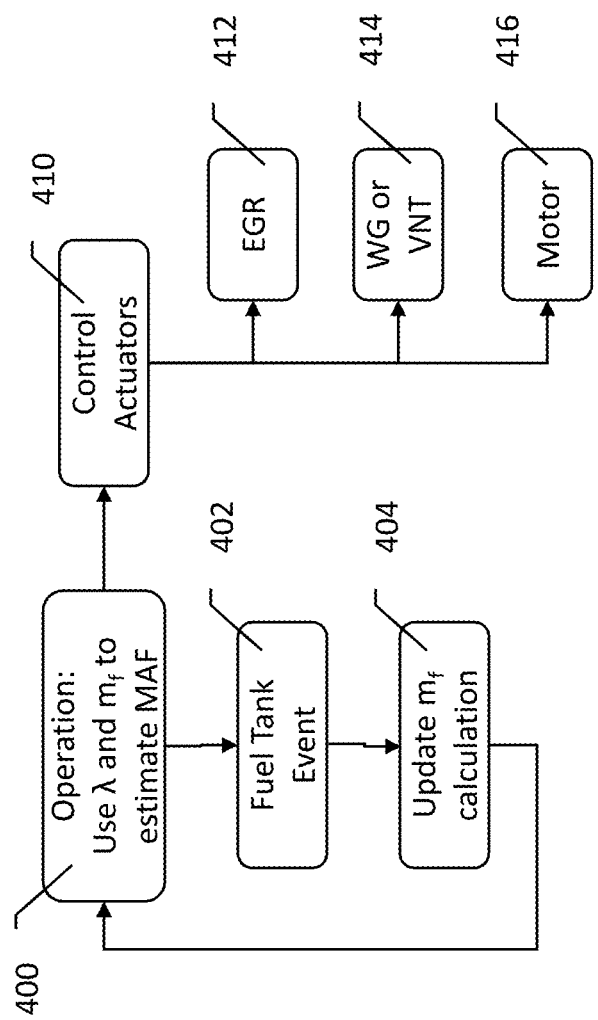

FIG. 9 shows another example. Here, at 400, the system is operated by using a lambda sensor output and the fuel mass metric $m_f$ to estimate MAF entering the engine. One or more actuators can then be controlled, as indicated at 410, to manipulate MAF to achieve a desired target or control a parameter (torque, power, efficiency, NOx or other pollutant generation, etc.). For example, an EGR valve 412 (whether high pressure or low pressure, or both) may be controlled to recirculate exhaust gasses, or a turbocharger speed may be controlled by manipulating WG position or VNT settings 414, or an electric motor 416 used in place of or to augment a turbocharger may be controlled. At a fuel tank event 402, the above methods are used to update the fuel mass metric $m_f$, in order to ensure and/or enhance accuracy of the control method.

Figure 10:
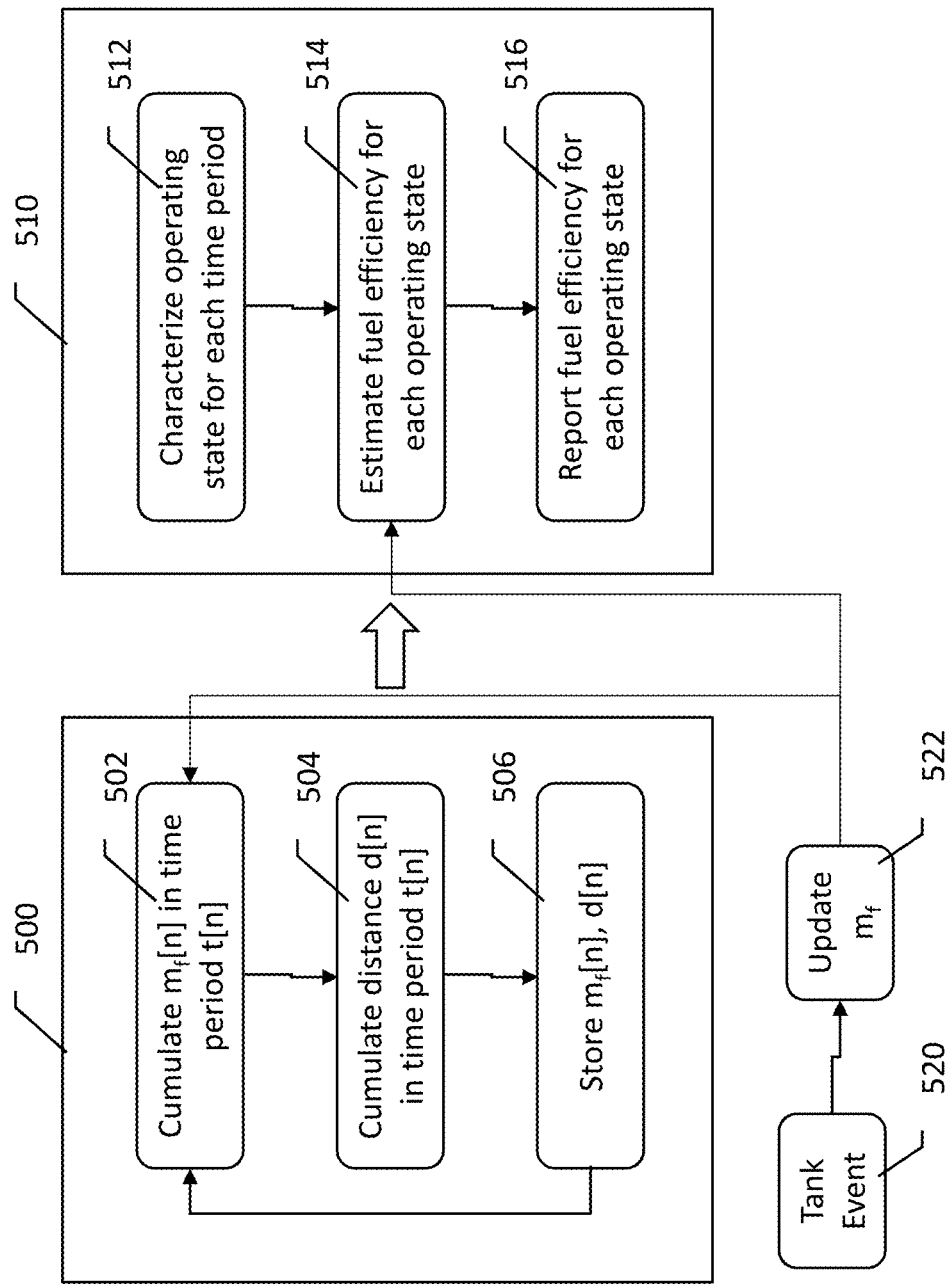

FIG. 10 shows another example. As noted in the Background, there is interest in monitoring the fuel consumption efficiency gap in modern vehicles. However, doing so with a single number (total fuel efficiency) is not the only option. In this example, fuel efficiency metrics can be further broken down by the type of operation of the vehicle during each period of time that it is operated in. Block 500 represents ongoing operation of a vehicle. In set time periods (ranging from less than one second up to a minute or more), the system accumulates the fuel mass $m_f$ for that time period, as indicated at 502. In the time period, the distance travelled is also accumulated, using an odometer input and/or GPS, as indicated at 504. Additional operating characteristics may be captured as well, including incline/decline, external weather or other conditions, and vehicle load, if desired. Additional operations of the vehicle may be considered as well, for example, if a concrete truck is spinning the concrete barrel, or if a vehicle has an air conditioner or a refrigerated compartment, power draws associated with such operations may additionally be characterized. The cumulated data is then stored, as indicated at 506 for each time period.

The stored data from block 500 may be used as indicated at 510. The operating state for the vehicle can be characterized for each time period as indicated at 512. A simple example, using common terminology, would be to characterize the vehicle state as either city or highway conditions. A more complex approach may account for each of speed, idling, changing speed (acceleration and/or deceleration), incline/decline/flat road, road type, weather conditions (wind, temperature, etc.) and so forth. Next, the fuel efficiency for each operating state can be estimated, as indicated at 514, referencing the fuel mass quantity and distance traveled. The results may be recorded and/or reported as indicated at 516.

When a tank event occurs, as indicated at 520, the fuel mass metric can be updated for subsequent time periods by adjusting the math used in block 502. In addition, looking back at the time period with data already stored, the estimated fuel efficiency in block 514 can also be updated. The method as shown assumes that any bias in $m_f$ is agnostic as to the operating conditions of the vehicle, however, this need not be the case. For example, depending on the type of vehicle and engine, it may be that $m_f$ is biased differently for different loads or other operating conditions. The ability to enhance the accuracy of $m_f$ during such calculations, particularly across multiple operating states can enable the system to present a more complete picture of fuel efficiency in the example of FIG. 10.

Figure 11:
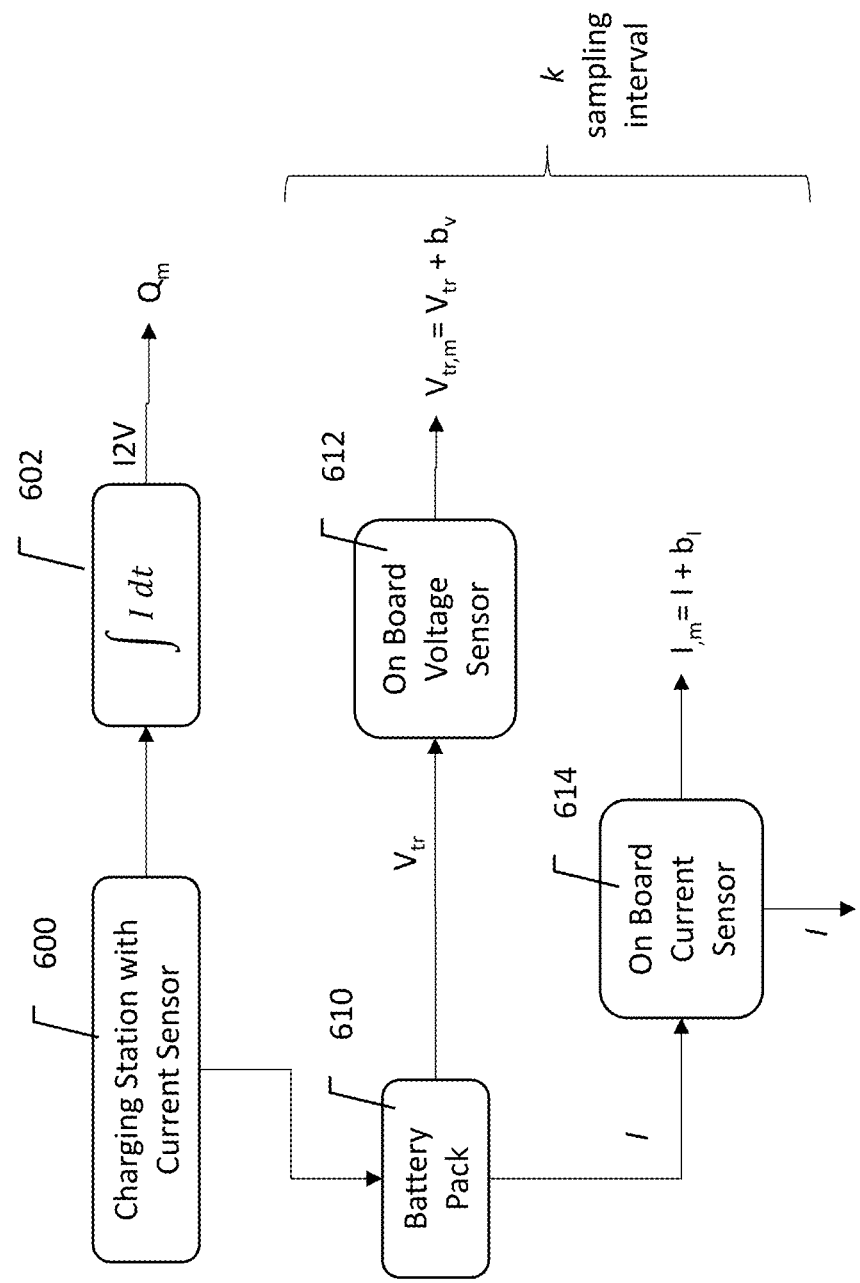
FIGS. 11-14 are block diagrams illustrating another example focused on a rechargeable battery vehicle.
Figure 12:
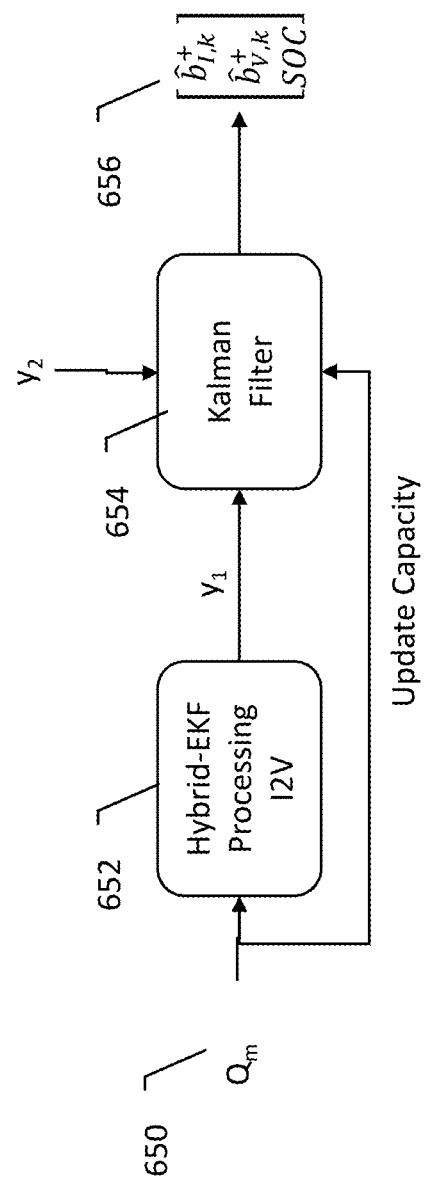
Figure 13:
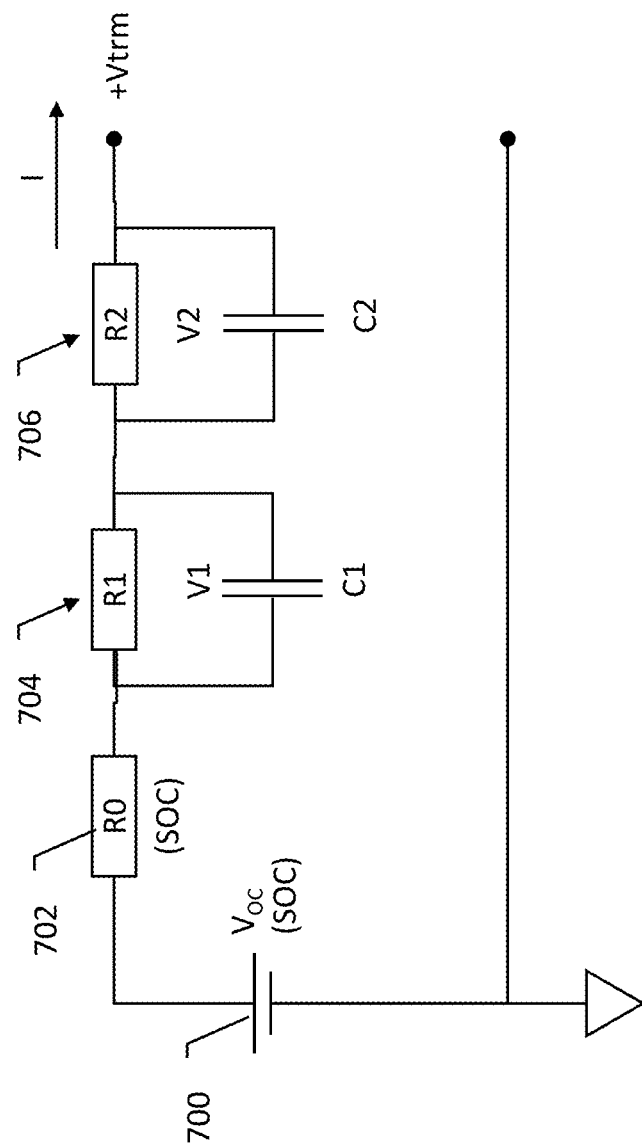

FIGS. 11-13 are block diagrams illustrating another example focused on a rechargeable battery vehicle. In FIG. 11, at block 600 the vehicle is at a charging station, wherein the charging station includes a current sensor to determine how much electrical charge/current is provided to the vehicle during charging. The sum of output current, as indicated at 602, may be communicated to the vehicle using 12V communications, providing a recharge quantity $Q_m$. The supplied charge from block 600 is delivered to a battery pack 610. The battery pack 610 may be of any suitable chemistry or design including but not limited to various lithium-ion chemistries such as lithium-nickel-cobalt-aluminum, lithium-nickel-manganese-cobalt, lithium-iron-phosphate, etc.

The battery pack 610 can be monitored for both terminal voltage, $V_{tr}$, and current output, I. An on-board voltage sensor 612 can be used to monitor $V_{tr}$. As battery pack 610 is discharged, the estimated state of charge (SOC) is used by the vehicle control system to determine when to advise the driver that the battery needs to be recharged. The monitored voltage $V_{tr,m}$ provides a noisy signal, subject to measurement bias $b_v$, and is also affected by load/draw conditions on the battery pack 610 at the time of measurement. For example, the internal impedance of the battery pack 610 itself will reduce the monitored voltage proportional to the current draw at the time of the measurement, and so the measured terminal voltage may be corrected to account for actual current draw. That is, as shown at the output of the on-board voltage sensor 612, the monitored terminal voltage can be represented by Equation 15:

$$V_{tr,m} = V_{tr} + b_v \qquad \text{\{Equation 15\}}$$

Both to aid in correcting the measured terminal voltage, and to monitor actual usage, an on-board current sensor 614 is provided as well. The current sensor measurement may be represented by Equation 16:

$$I_m = I + b_I \qquad \text{\{Equation 16\}}$$

Where $I_m$ is the measured current and $b_I$ is the bias associated with the current measurement. These measurements may be performed at a sampling interval, as indicated to the right-hand side of FIG. 11.

The internal impedance may change as the battery ages. Usable battery capacity can also vary over time; the typical aging of a battery includes an increasing internal impedance and decreasing useful capacity. Depending on the battery type, there are additional factors, including temperature, can create variations in battery performance (low temperatures may increase internal impedance). All these factors introduce noise to the process of monitoring battery usage when the vehicle is moving.

One approach to monitoring battery aging is to discharge the battery pack to a fixed or known state, which can be treated as a nominal "discharged" state. The known state may be defined by a fixed terminal voltage. A nominal "charged" state can also be defined, again using a fixed terminal voltage. For example, the nominal discharged state may be when the open circuit terminal voltage is at 3.3V (per cell), and the nominal charged state may be when the open circuit terminal voltage is at 4.2V (per cell). By monitoring charging and determining the amount of charge needed to take a battery from discharged to charged state, the capacity of the battery can be calculated.

Many users will recharge the battery before it reaches the nominal discharged state, however. Accurately determining the terminal voltage may enable determination of the actual battery capacity without requiring a full discharge and recharge. In addition, many users will rely on the control system for the vehicle to accurately estimate remaining battery capacity when deciding, for example on a long trip, when/where to stop and recharge the battery. Improved accuracy in determining the state of charge of the battery pack will also be helpful.

Charge put into the battery can be represented as shown in Equation 17:

$$\dot{Q} = I + b_I + w_1 \qquad \text{\{Equation 17\}}$$

Where I is the true current into the battery, $b_I$ is the onboard current sensor bias, and $w_1$ is the process noise. Bias dynamics can be defined by Equation 18:

$$\dot{b}_I = w_2 \qquad \text{\{Equation 18\}}$$

Where $w_2$ is the bias dynamics process noise. Equations 17 and 18 may be used for the rechargeable battery case (such as for an electric vehicle or a plug-in hybrid electric vehicle) in place of Equations 3 and 4, above. A multiplicative approach may be used instead, analogous to using Equation 5 instead of Equation 3, as also explained above.

The I2V measurement, given by the charge station at a charging event, can be given as shown in Equation 19:

$$y_i = Q_i + v_i \qquad \{\text{Equation 19}\}$$

In which $y_i$ is the I2V charge measurement $Q_{m,i}$, $Q_i$ is the integrated charge provided by the battery utilization model, and $v_i$ is the discrete measurement noise. The aim in this example is to accurately track the bI value and provide diagnostics and prognostics in the time series. FIGS. 1-4, above, may be used with the modeled current utilization in place of the modeled fuel mass.

Sensor/data fusion can then take place. FIG. 12 shows a two stage Kalman filter, similar generally that of FIG. 6. The charge quantity communicated from the charging station, Qm 650 is provided to a hybrid EKF 652 to process the I2V communication, outputting $y_1$ as shown. In the process, $y_1$ is provided to a Kalman filter 654, which also receives the terminal voltage measurement as y2, as shown. The Kalman filter 654 provides as its output the estimated, most recent, current and voltage biases, as indicated at 656. Equations 20-21 may be used:

$$y_{1,k} = b_{1,k} + v_{1,k} \qquad \{\text{Equation 20}\}$$

$$y_{2,k} = V_{oc} - V_{1,k} - V_{2,k} - (I_k + b_{I,k})R_o + b_{V,l} + v_{2,k} \qquad \{\text{Equation 21}\}$$

Where $y_1$ is the pseudo-measurement of the current bias, that is, the last estimated current bias at the charge event provided by the hybrid EKF. Also, $y_2$ is the terminal voltage measurement, $V_1$, and $V_2$ are the 2RC model voltages, I is the true current, $b_{I,k}$ is the current bias, $b_{V,k}$ is the voltage bias, and $v_1$ and $v_2$ are the discrete time white noises defined by the covariance or R matrix of the Kalman Filter. The state of charge (SOC) equation, with 2RC dynamics in the Kalman filter is then a function of capacity of the battery. Matrices MEC1 and MEC2 can be used as before, though now the "tank event" is instead understood as a battery recharge.

As noted, in the above, a 2RC model for the battery is used; such a model/equivalent is shown in FIG. 13. The 2RC model includes the voltage source 700, having an open circuit voltage VOC. Ohmic resistance of the battery itself is modeled as RO at 702. A first RC block is shown at 704, having a resistance R1 parallel with a capacitor C1, representing the diffusion of positive lithium ions across the concentration gradient and the mass transport effects and dynamic voltage performances and the accumulation and dissipation of charge in the electrical double layer. A second RC block is shown at 706 and accounts for diffusion resistance (R2) and diffusion capacitance (C2), in parallel. This model is built into the Kalman Filter 654 with the measurement Equation 21. The skilled person will understand that the concepts are not limited to the 2RC battery model shown; a single RC model or a resistance model may instead be used, with appropriate updating of Equation 21 to match.

As with the fuel mass modelling in the earlier examples, the errors associated with the current measurement bias and/or terminal voltage measurement bias will be converge to zero with repeated cycling. If new errors occur, or as the battery ages, these biases may diverge from zero. For example, referring now to FIG. 8, block 352 can be, for an electric vehicle (EV), a charging event. At the time of the charging event, the system can calculate the accumulated current flow out of the battery since a last charging event. The error metric, $e_n$, can then be calculated by comparing the reported quantity of charge delivered by the charging station to the accumulated current flow out of the battery. If $e_n$ is convergent at 356, the system simply returns to normal operation 350. Otherwise, the system may determine a rate of change of $e_n$ at 380 and estimate remaining battery life at 382 by extrapolating toward an end of life metric for the battery. For example, the difference between accumulated charge used and that supplied during the recharging session may be assumed to represent a reduction in the total capacity of the battery, without requiring a full discharge-charge cycle. A metric can be set of such reduction in total capacity over time, and end-of-life estimated in terms of a set duration or a quantity of recharging cycles. As before the data generated in these operations may be stored onboard or communicated off vehicle, as desired.

In another example, by addressing the internal biases over time, a more accurate understanding of charge consumption and thus energy efficiency can be gained, both as an overall metric of performance and also in a granular manner as shown above in FIG. 10. That is, by providing a precise correction of the current consumption measured by the onboard current measurement, the actual operating efficiency of the vehicle can be determined in a granular manner.

Figure 14:
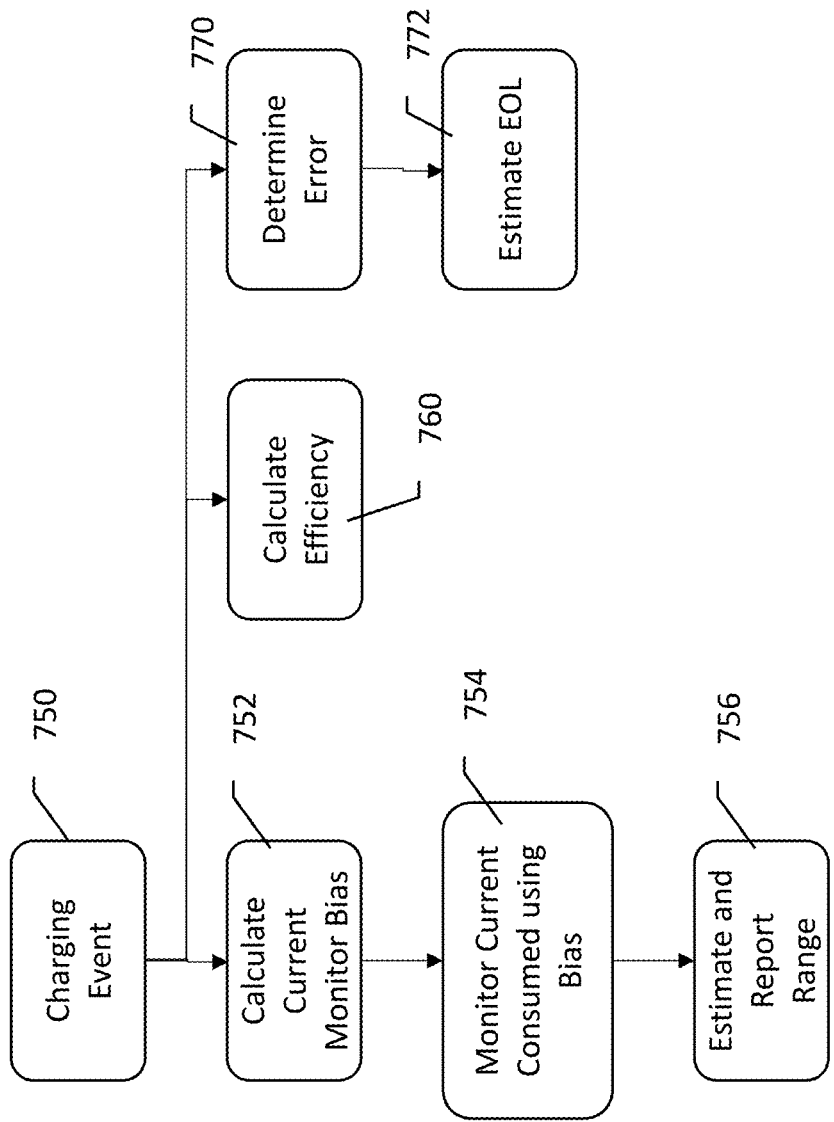

FIG. 14 shows certain illustrative examples. At a charging event 750, the system receives from the charging station a quantity of charge added to the battery. This data can be used to calculate the current monitor bias at 752. The system then uses the updated current monitor bias from block 752 (following the charging event) to monitor current consumed by the battery, as indicated at 754. Knowing with precision the amount of current consumed, the vehicle range can be estimated, and reported to the driver, as indicated at 756. In addition, the efficiency of the vehicle can be calculated, as indicated at 760. The efficiency calculation can be retrospective, looking back at the usage before the charging event 750 using stored data and may be granular as shown in FIG. 10 above. The efficiency calculation may be prospective as well, for monitoring usage following the charging event 750, again with or without the granular approach of FIG. 10.

The system may also calculate the error between the accumulated charge usage measured on-board, and the charge supplied during the charging event 750. This error may be treated as a reduction in the battery capacity. Using one or more such error measurements, the end of life of the battery may be calculated. As a greatly simplified example, if the total capacity of the battery is 20,000 Ah, end of life may be defined as occurring when 12,000 Ah of capacity remains. If the error at 770 is determined to be 100 Ah, and if a prior known total capacity (using a deep-discharge cycle) is known, or if the nominal new battery capacity is known, then the number of remaining charge cycles can be readily calculated by dividing the useful life total reduction (8,000 Ah) by the reduction associated with the most recent charging event (100 Ah), suggesting 80 charging cycles (8,000 divided by 100) remain.

In some examples, the methods illustrated in FIG. 14 may be performed as follows. In the system, there are both battery voltage measurements available, and current measurements. The battery voltage measurements may be treated as providing an indication of the battery capacity. That is, supposing that during a recharge event, the battery open circuit (or lightly loaded) voltage is increased from a first voltage to a second voltage ($V_1$ to $V_2$). That change in voltage can be used to determine the amount of charge that has been received by the battery, with or without communication to the recharging station in some examples. Thus the battery capacity change, rather than communicated charge delivered metrics, may be used in place of $Q_i$ in Equation 19. Over time, as the total capacity of the battery degrades, the amount of charge needed to cause an increase of open circuit voltage from $V_1$ to $V_2$ drops. When the calculation is available, the decrease in battery capacity can thus be determined.

Some systems may use the change in battery voltage during a recharge event to calculate the efficiency of the recharging event itself. That is, different charging modes or setups may be more or less efficient in terms of the quantity of charge supplied by a recharging station and that which actually gets stored in the battery. The charge supplied to the battery during a recharging event may be corrected using the estimated efficiency of the recharging event, before other calculations including the current bias are performed. As a result, the $Q_i$ term in Equation 19, for example, may be corrected for charging efficiency.

During usage of the vehicle, the battery voltage as it degrades can be used to estimate the remaining quantity of charge stored in the battery. The current drawn from the battery is estimated using the on-board current monitor. The bias term can thus be updated, with or without a recharging event, by determining the quantity of charge used based on the battery voltage measurement, and comparing to the estimated current drain, by reference to a first point in time and a second point in time.

Battery self-discharge may also be accounted for. In an example, the current lost to battery self-discharge is treated as a constant, and therefore calculation of the battery self-discharge is performed by multiplying an estimated battery self-discharge by an appropriate period of time where the period of time used for battery self-discharge calculation is the same as that during which the estimated battery current usage is calculated. The self-discharge term, generally speaking, will be relatively small in most calculations (estimates of self-discharge typically being less than 1% per month for most chemistries), and may be ignored in some examples, being captured as a process noise.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A vehicle comprising:
   a rechargeable battery;
   a motor configured to move the vehicle using current obtained from the rechargeable battery;
   a controller configured to monitor energy consumption by the vehicle using an onboard current monitor;
   a communication apparatus coupled to the controller and configured for communication with an offboard charging station; wherein:
   the controller is configured track a bias term associated with the onboard current monitor;
   the controller is configured to load charging data from the communication apparatus to determine a quantity of charge added to the battery by the offboard charging station in a charging event;
   responsive to receiving the charging data from the communication apparatus, the controller is configured to update the bias term; and
   the controller is configured to use the updated bias term to track current consumption following the receipt of the charging data to determine and report range of the vehicle to a user.

2. The vehicle of claim 1 wherein the controller is configured to estimate a quantity of charge used in the vehicle prior to the charging event using data from the onboard current monitor and the bias term, and to calculate remaining battery life by comparing the estimated quantity of charge used to the quantity of charge added.

3. The vehicle of claim 1 wherein the controller is configured to use the bias term to calculate efficiency of the vehicle.

4. The vehicle of claim 1 wherein the controller is further configured to update the bias term in the following manner:
determine an estimated quantity of charge used from a first recharging event to a second recharging event by using the onboard current monitor;
comparing the estimated quantity of charge used to the quantity of charge added to the battery; and
calculating and implementing an adjustment to the bias term.

5. The vehicle of claim 1 wherein the controller is further configured to update the bias term without a recharging event taking place, by monitoring a change in a voltage output by the battery to determine a change in remaining capacity of the battery between a first point in time and a second point in time, and comparing the change in remaining capacity of the battery to estimated current consumed between the first point in time and the second point in time.

6. A method of tracking current usage in an electric vehicle, the electric vehicle including a rechargeable battery, a motor configured to move the vehicle using current obtained from the rechargeable battery, a controller configured to monitor current consumption by the vehicle using an onboard current monitor, and a communication apparatus coupled to the controller and configured for communication with an offboard charging station, the method comprising:
the onboard current monitor measuring current usage in the vehicle and providing an output to the controller;
the controller tracking a bias term associated with the output of the onboard current monitor;
the controller using the communication apparatus to obtain a measured a quantity of charge added to the battery by the offboard charging station in a charging event;
responsive to receiving the charging data from the communication apparatus, the controller updating the bias term;
the controller using the updated bias term to track current consumption following the receipt of the charging data to determine range of the vehicle; and
the controller reporting the determined range of the vehicle to a user.

7. The method of claim 6, further comprising:
the controller estimating a quantity of charge used in the vehicle prior to the charging event using data using the output from the onboard current monitor and the bias term; and
the controller calculating a remaining battery life by comparing the estimated quantity of charge used to the quantity of charge added.

8. The method of claim 6, further comprising the controller using the bias term to calculate efficiency of the vehicle.

9. The method of claim 6, wherein the step of the controller updating the bias term is performed by:
determining an estimated quantity of charge used from a first recharging event to a second recharging event by using the onboard current monitor;
comparing the estimated quantity of charge used to the quantity of charge added to the battery; and
calculating and implementing an adjustment to the bias term.

10. The method of claim 6, further comprising the controller updating the bias term without a recharging event taking place, by:
monitoring a change in a voltage output by the battery;
determining a change in remaining capacity of the battery between a first point in time and a second point in time; and
comparing the change in remaining capacity of the battery to estimated current consumed between the first point in time and the second point in time.

11. The method of claim 6, wherein the output of the onboard current monitor includes a measured current value having a measurement bias, and the bias term is tracked to estimate the measurement bias.

12. The vehicle of claim 1, wherein the onboard current monitor outputs a measured current value having a measurement bias, and the bias term is tracked to estimate the measurement bias.

* * * * *